(12) United States Patent
Choi et al.

(10) Patent No.: US 7,492,043 B2
(45) Date of Patent: Feb. 17, 2009

(54) POWER MODULE FLIP CHIP PACKAGE

(75) Inventors: Seung-yong Choi, Seoul (KR); Jonathan A. Noquil, Bucheon-si (KR)

(73) Assignee: Fiarchild Korea Semiconductor, Ltd, Bucheon (KR)

( * ) Notice: Subject to any disclaimer, the term of this patent is extended or adjusted under 35 U.S.C. 154(b) by 358 days.

(21) Appl. No.: 10/927,424

(22) Filed: Aug. 26, 2004

(65) Prior Publication Data
US 2005/0087854 A1 Apr. 28, 2005

(30) Foreign Application Priority Data
Aug. 27, 2003 (KR) .................. 10-2003-0059487

(51) Int. Cl.
*H01L 23/34* (2006.01)
*H01L 23/48* (2006.01)

(52) U.S. Cl. .............. 257/724; 257/738; 257/E23.026; 257/E23.062

(58) Field of Classification Search .......... 257/E23.026, 257/E23.062
See application file for complete search history.

(56) References Cited

U.S. PATENT DOCUMENTS

| | | | | |
|---|---|---|---|---|
| 5,222,014 | A * | 6/1993 | Lin ............................. | 361/792 |
| 6,442,033 | B1 * | 8/2002 | Liu et al. .................... | 361/743 |
| 6,645,791 | B2 * | 11/2003 | Noquil et al. ............... | 438/108 |
| 6,893,901 | B2 * | 5/2005 | Madrid ....................... | 438/122 |
| 2004/0113281 | A1 * | 6/2004 | Brandenburg et al. ........ | 257/778 |
| 2005/0040518 | A1 * | 2/2005 | Brandenburg et al. ........ | 257/712 |
| 2005/0218509 | A1 * | 10/2005 | Kipnis et al. ................ | 257/723 |

* cited by examiner

*Primary Examiner*—Lex Malsawma
(74) *Attorney, Agent, or Firm*—Thomas R. Fitzgerald, Esq.; Robert D. Lott, Esq.; Hiscock & Barclay, LLP

(57) ABSTRACT

A power module flip chip package is provided. The power module flip chip package includes a package carrier having a front surface and a back surface facing the front surface, and a power semiconductor device electrically connected to the front surface of the package carrier via conductive bumps. The conductive bumps are electrically connected to a gate terminal, a source terminal, and a drain terminal of the power semiconductor device. The power module flip chip package has reduced resistance and inductance and improved reliability.

10 Claims, 6 Drawing Sheets

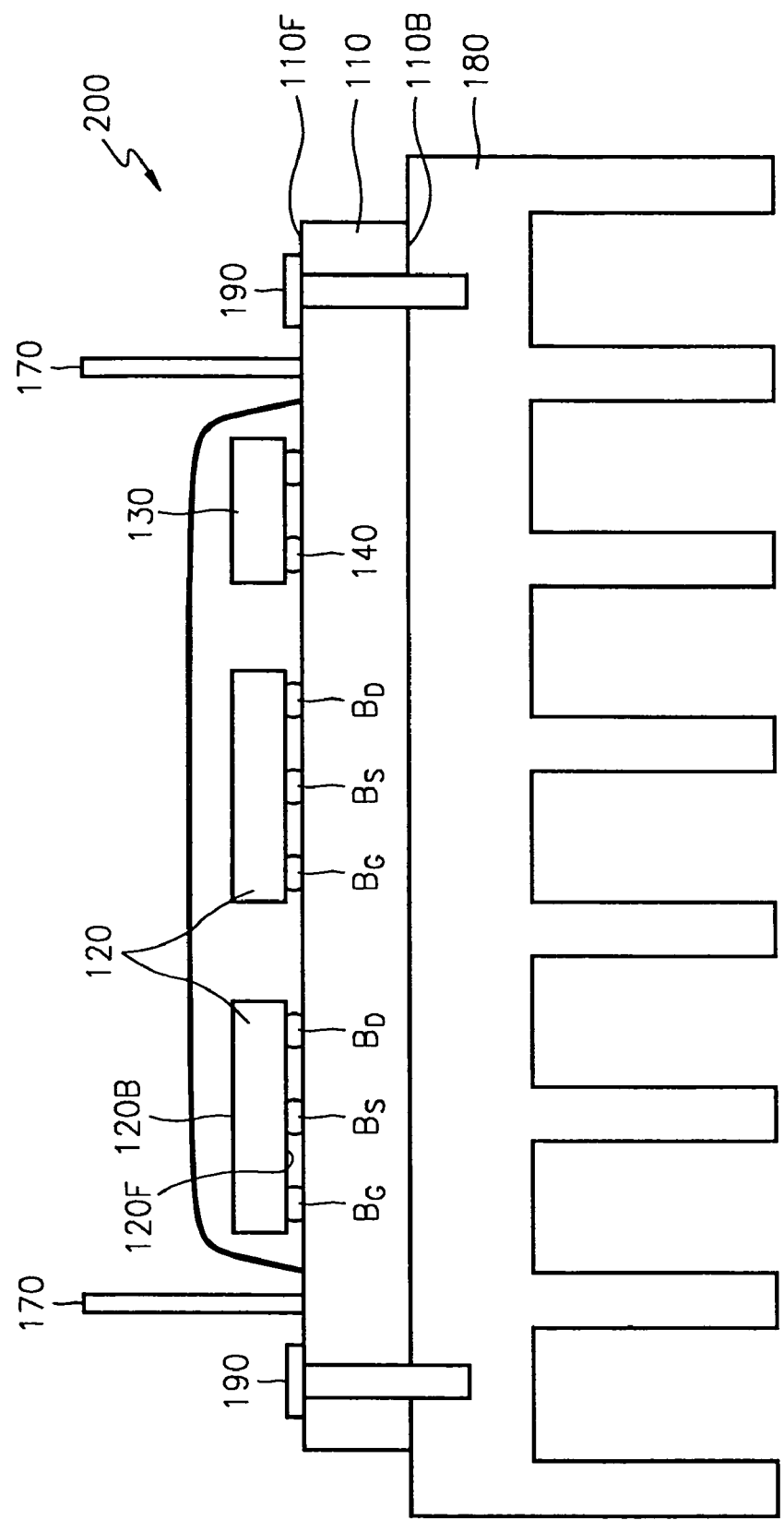

US 7,492,043 B2

POWER MODULE FLIP CHIP PACKAGE

BACKGROUND OF THE INVENTION

This application claims the priority of Korean Patent Application No. 2003-59487, filed on Aug. 27, 2003, in the Korean Intellectual Property Office, the disclosure of which is incorporated herein in its entirety by reference.

1. Field of the Invention

The present invention relates to a power module package formed of a power semiconductor device and other related devices, and more particularly, to a power module flip chip package in which the power semiconductor device is packaged using a flip chip method.

2. Description of the Related Art

Power module packages that are widely used at present use wire bonding which is a source of high resistance and noise. Recently, as power modules have been highly efficient, the number of connections using wire bonding has increased by ten to thirty times. However, the added number of bond wires has increased the resistance, signal delay, and signal interference and that has limited the further efficiency and density of future power modules.

In addition, it is difficult to apply the power module packages which use wire bonding to various combinations of a power semiconductor device and additional devices (e.g., control circuit device, protection circuit device, etc.) that have a variety of applications.

A power module package that reduces the resistance and inductance caused by the wired bonding is disclosed in the U.S. Pat. No. 6,442,033. The power module package disclosed in the above patent is formed of a power semiconductor device placed between two package substrates.

However, since the power semiconductor device is placed between the two package substrates, the power module package is limited to package substrates that have similar Young's Modulus and coefficients of thermal expansion. The packaging process is also very complicated.

SUMMARY OF THE INVENTION

The present invention provides a power module package having reduced resistance and inductance and increased reliability.

In addition, the present invention also provides a package suitable for a power module in which a power semiconductor device and various additional devices are included.

Furthermore, the present invention also provides a power module package which can be embodied by a simplified process.

According to an aspect of the present invention, there is provided a power module flip chip package comprising a package carrier having a front surface and a back surface on the opposite side of the front surface; and a power semiconductor device electrically connected to the front surface of the package carrier via conductive bumps, wherein the conductive bumps are electrically connected to a gate terminal, a source terminal, and a drain terminal of the power semiconductor device.

BRIEF DESCRIPTION OF THE DRAWINGS

The above and other features and advantages of the present invention will become more apparent by describing in detail exemplary embodiments thereof with reference to the attached drawings in which:

FIG. 3 is a cross-section of a power module flip chip package according to a second embodiment of the present invention;

DETAILED DESCRIPTION OF THE INVENTION

Figure 1:
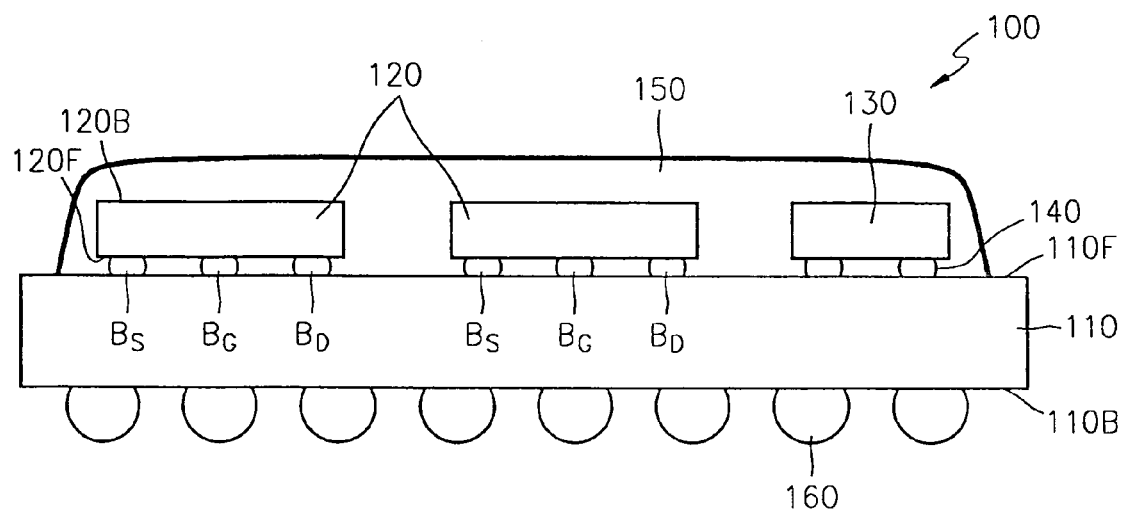
FIG. 1 is a cross-section of a power module flip chip package according to a first embodiment of the present invention.

The present invention will now be described more fully with reference to the attached drawings, in which exemplary embodiments thereof are shown. This invention may, however, be embodied in many different forms and should not be construed as being limited to the embodiments set forth herein; rather these embodiments are provided so that this disclosure will be thorough and complete, and will fully convey the concept of the invention to those skilled in the art. In the drawings, the forms of elements are exaggerated for clarity. To facilitate understanding, identical reference numerals have been used for like elements throughout the figures.

According to specific embodiments of the present invention, a power semiconductor device is electrically connected to a package carrier using a flip chip method, and thus a power module flip chip package without wire bonding is realized. Moreover, according to one or more specific embodiments of the inventions, a power module package may comprise only one package carrier. Therefore, the power module package has a simple structure and better performance and is easy to modify in a simplified manufacturing process is obtained.

FIG. 1 is a cross-section of a power module flip chip package 100 according to a first embodiment of the present invention. The first embodiment of the present invention relates to a power module flip chip package embodied as a ball grid array (BGA) type. The present embodiment is suitable for a package of a high performance device with a plurality of I/O pins.

A package carrier 110 has a front surface 110F and a back surface 110B. The package carrier 110 may be a molded lead frame, a printing circuit board, a direct bond copper (DBC) substrate, etc. The DBC substrate indicates a package carrier in which copper layers are respectively attached to both surfaces of an insulated ceramic substrate.

A power semiconductor device 120 also has a front surface 120F and a back surface 120B. The front surface 120F of the power semiconductor device 120 is electrically connected to the front surface 110F of the package carrier 110 via conductive bumps $B_G$, $B_S$, and $B_D$. BG is connected to a gate terminal (not shown) of the power semiconductor device 120 and $B_S$ is connected to a source terminal (not shown), and $B_o$ is connected to a drain terminal (not shown).

An auxiliary device 130, is electrically connected to the front surface 110F of the package carrier 110 via conductive bumps 140, in a manner similar to the way the power semiconductor device is electrically connected to the front surface 110F.

The auxiliary device 130 may comprise a control circuit, a protection circuit, a drive circuit, a sensor, such as a thermistor, or various combination of these four devices.

The power semiconductor device 120 and the auxiliary device 130 are covered by an epoxy resin 150. The epoxy resin 150 protects the power semiconductor device 120 and the auxiliary device 130 and disperses heat emitted when these devices 120 and 130 operate. Therefore, the epoxy resin 150 is preferable to be a material having high heat-resistance, chemical stability, and certain strength. Thus, it is recommended that the epoxy resin 150 is formed with an epoxy molding compound (EMC) composed of the epoxy resin combined with a filler, flame retardants, a hardener, a release agent, a pigment, or a catalyst, or other resin having similar fluidity.

A plurality of conductive ball arrays 160 are formed on the back surface 11OF of the package carrier 110. The carrier 110 has conductive vias or leads that extend from conductive balls of array 160 to the conductive bumps 140 and conductive bumps $B_G$, $B_S$, and $B_D$.

Figure 2A:
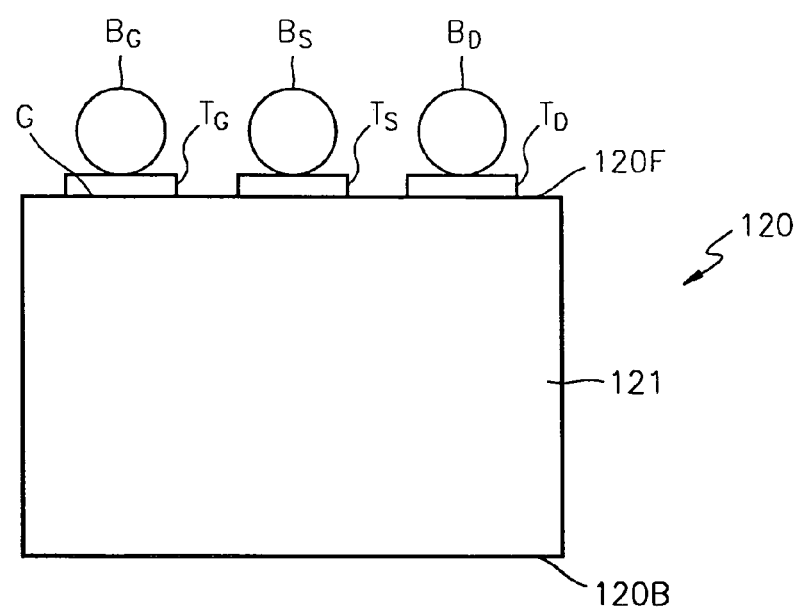
FIGS. 2A and 2B are cross-sections of a power semiconductor device of the power module flip chip package of FIG. 1.
Figure 2B:
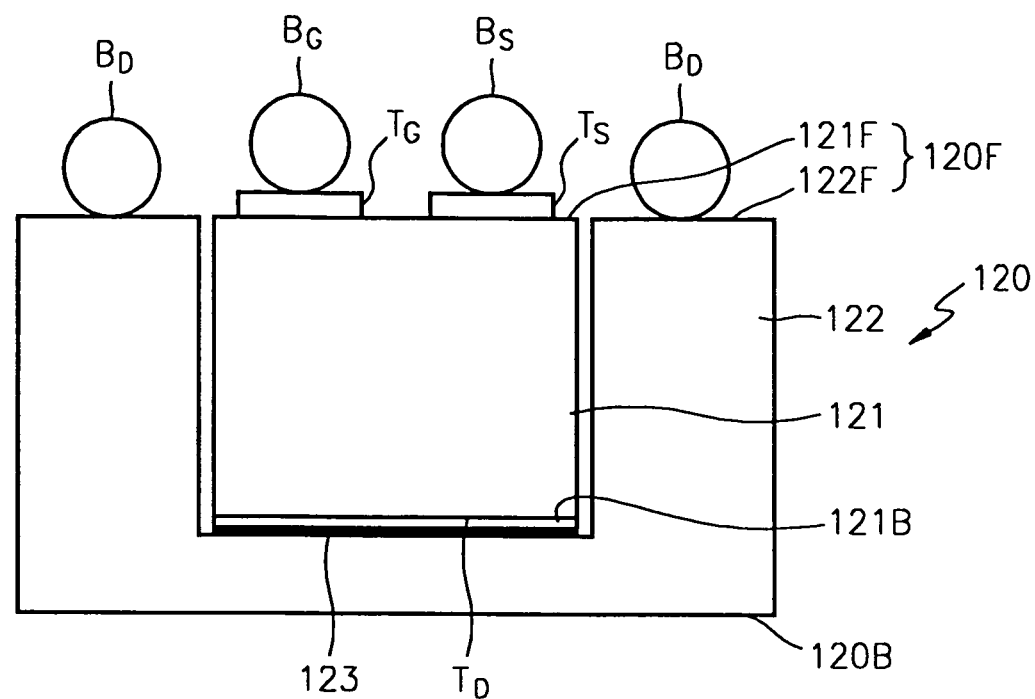

FIGS. 2A and 2B are cross-sections of a power semiconductor device of the power module flip chip package of FIG. 1. The power semiconductor device 120 used in the power module flip chip 100 comprises a power metal-oxide-semiconductor field-effect-transistor (MOSFET) die as in FIG. 2A or an individually packaged power MOSFET die in FIG. 2B. FIGS. 2A and 2B are exemplary, and thus they can be modified in various ways.

Referring to FIG. 2A, a power MOSFET die 121 is a lateral diffused (LD) MOSFET die which comprises a gate terminal (TG), a source terminal ($T_s$), and a drain terminal (TD). The power module flip chip package is formed by respectively connecting the gate terminal TG, the source terminal TS, and the drain terminal TD to the conductive bumps $B_G$, $B_S$, and $B_D$.

Referring to FIG. 2B, a power MOSFET die 121 is individually packaged by being attached to a conductive housing 122. Specifically, the power MOSFET die 121 in FIG. 2B is a vertical channel MOSFET die which comprises the gate terminal $T_G$ and the source terminal $T_S$ on a front surface 121F of the power MOSFET die 121, and the drain terminal $T_D$ on a back surface 121B of the power MOSFET 121. The front surface 120F of the power semiconductor device 120 is formed of the front surface 121F of the power MOSFET die 121 and a coplanar front surface 122F of the conductive housing 122, both of which lie in the same plane. The power module flip chip package is formed by connecting the front surface 120F of the power semiconductor device 120 to the conductive bumps $B_G$, $B_S$, and $B_D$. The conductive bump $B_D$ is connected to the drain terminal $T_D$ via the conductive housing 122. The drain terminal $T_D$ and the conductive housing 122 are electrically connected via a conductive solder 123. The power semiconductor device in which the power MOSFET die 121 is individually packaged as shown in FIG. 2B is disclosed in the commonly assigned U.S. Pat. No. 6,133,634. The above patent is incorporated by reference as fully set forth herein.

Conductive bumps 140, $B_G$, $B_S$, and $B_D$ may be ball or square types. The conductive bumps 140 may be formed with metals such as Au, solder, or Cu, a conductive resin formed by mixing a resin with metal particles, or a resin-metal composite having a resin covered by a metal material. In addition, the conductive bumps $B_G$, $B_S$, and $B_D$ may be formed by the following methods: evaporation, electroplating, screen printing, solder ball mounting, studding, etc. The conductive bumps $B_G$, $B_S$, and $B_D$ may further have an under bump metallurgy (UBM). If the conductive bumps $B_G$, $B_S$, and $B_D$ are formed by a soldering method, reliability can be enhanced by connecting the package carrier 110 and the power semiconductor device 120 via the solder bumps $B_G$, $B_S$, and $B_D$ and by covering and hardening a connection result by underfill.

Figure 2C:
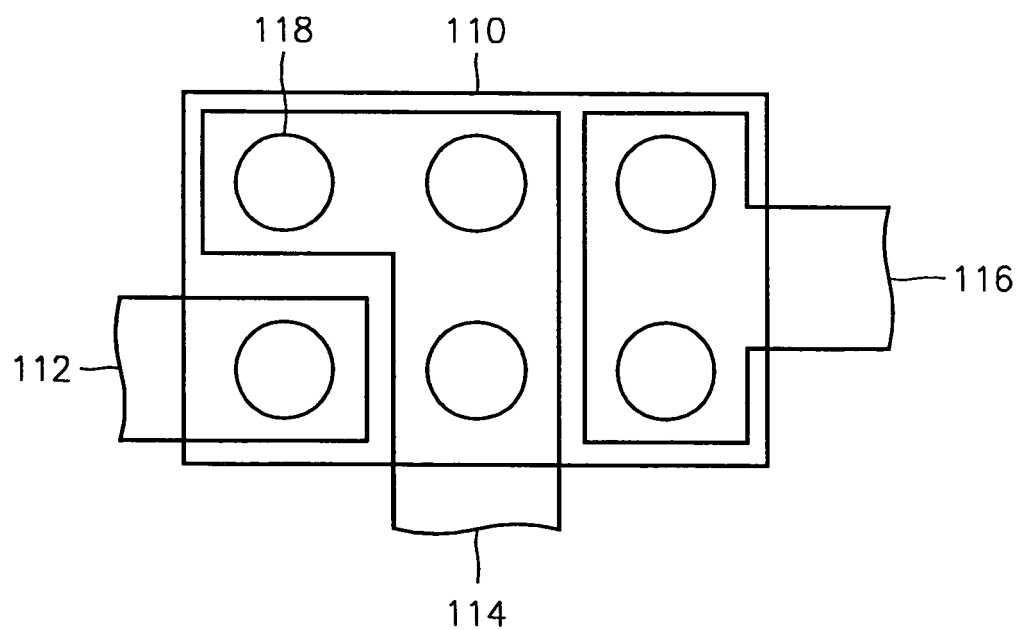
FIG. 2C is a top plan view of a package carrier of the power module chip package of FIG. 2.

FIG. 2C is a top plan view of a package carrier 110 of the power module chip package of FIG. 1.

Referring to FIG. 2C, traces 112, 114, and 116, which couple to the conductive bumps $B_G$, $B_S$, and $B_D$, are formed on an upper surface of the package carrier 110. The traces 112, 114, and 116 are formed with a metal such as Cu and consist of a gate trace 112, a source trace 114, and a drain trace 116. A circle 118 indicates a place where the conductive bumps BG, BS, and Bp are coupled to the traces 112, 114, and 116.

FIG. 3 is a cross-section of a power module flip chip package 200 according to a second embodiment of the present invention. The second embodiment is suitable for a case where a heat resistant function is an important parameter in the package.

Referring to FIG. 3, in the power module flip chip package 200, a package carrier 110, one or more power semiconductor devices 120, and an auxiliary device 130 are electrically connected using the flip chip method used in the first embodiment of the present invention. However, the second embodiment is different from the first embodiment because signals are input and output via an external lead 170 rather than a ball grid array (BGA) and the power module flip chip package 200 further includes a heat sink 180, which connects to a back side 110B of the package carrier 110.

The package carrier 110 and the heat sink 180 are connected by a fastener 190. Instead of the fastener 190, the heat sink 180 may also be attached to the package carrier 110 by a high thermal liquid epoxy compound, a thermal tape, or a solder for high temperature.

The heat sink 180 may be formed using a metal such as Au, ceramic, or plastic. The heat sink 180 is disclosed in commonly assigned U.S. patent application Ser. No. 10/167,067. The above patent application is incorporated by reference as fully set forth herein.

Figure 4:
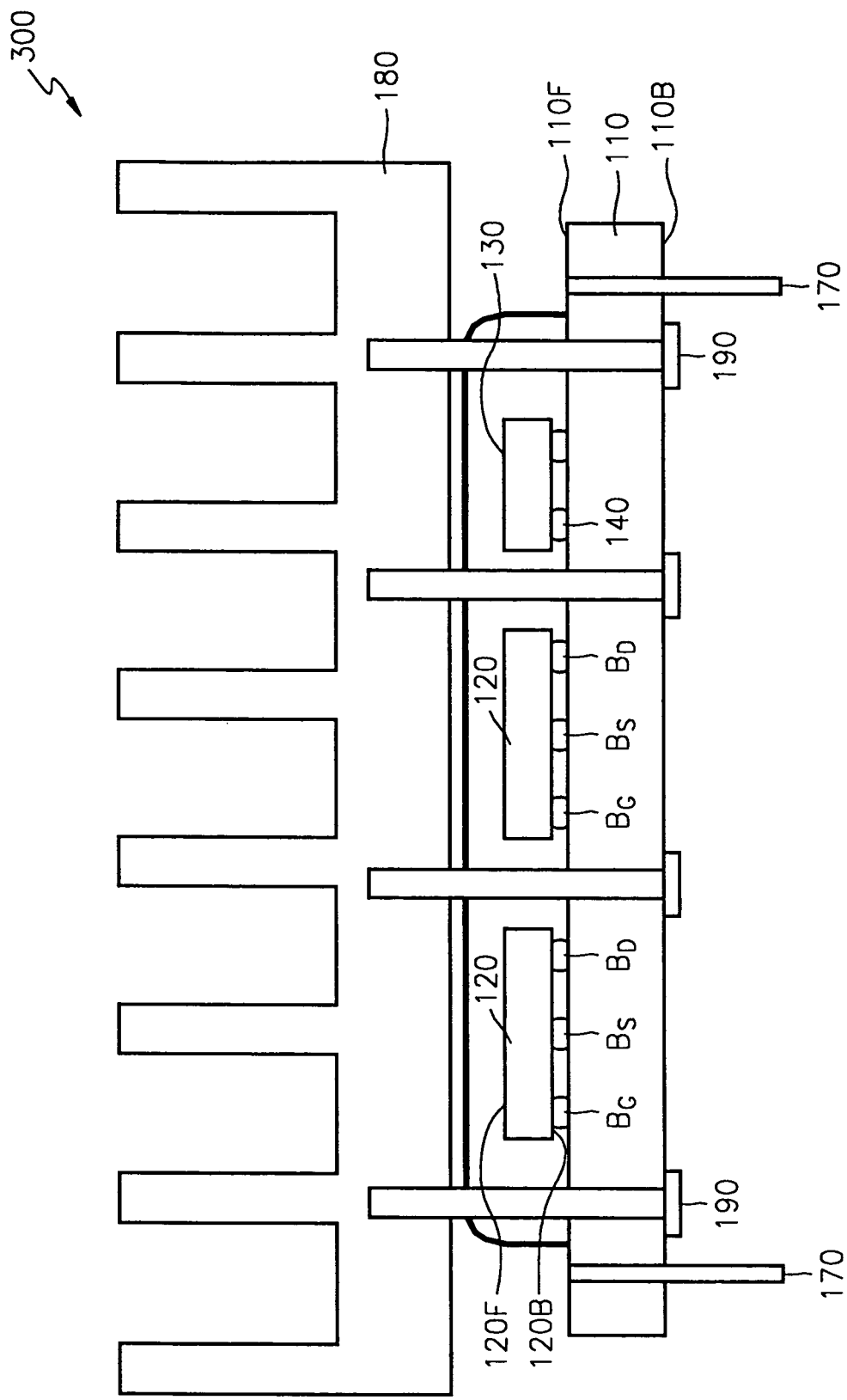
FIG. 4 is a cross-section of a power module flip chip package according to a third embodiment of the present invention.

FIG. 4 is a cross-section of a power module flip chip package 300 according to a third embodiment of the present invention. Like the second embodiment, the third embodiment is suitable for the case where a heat resistant function is the important parameter of the package. However, the third embodiment is different from the second embodiment in that a heat sink 180 is formed on an epoxy resin 150.

Figure 5:
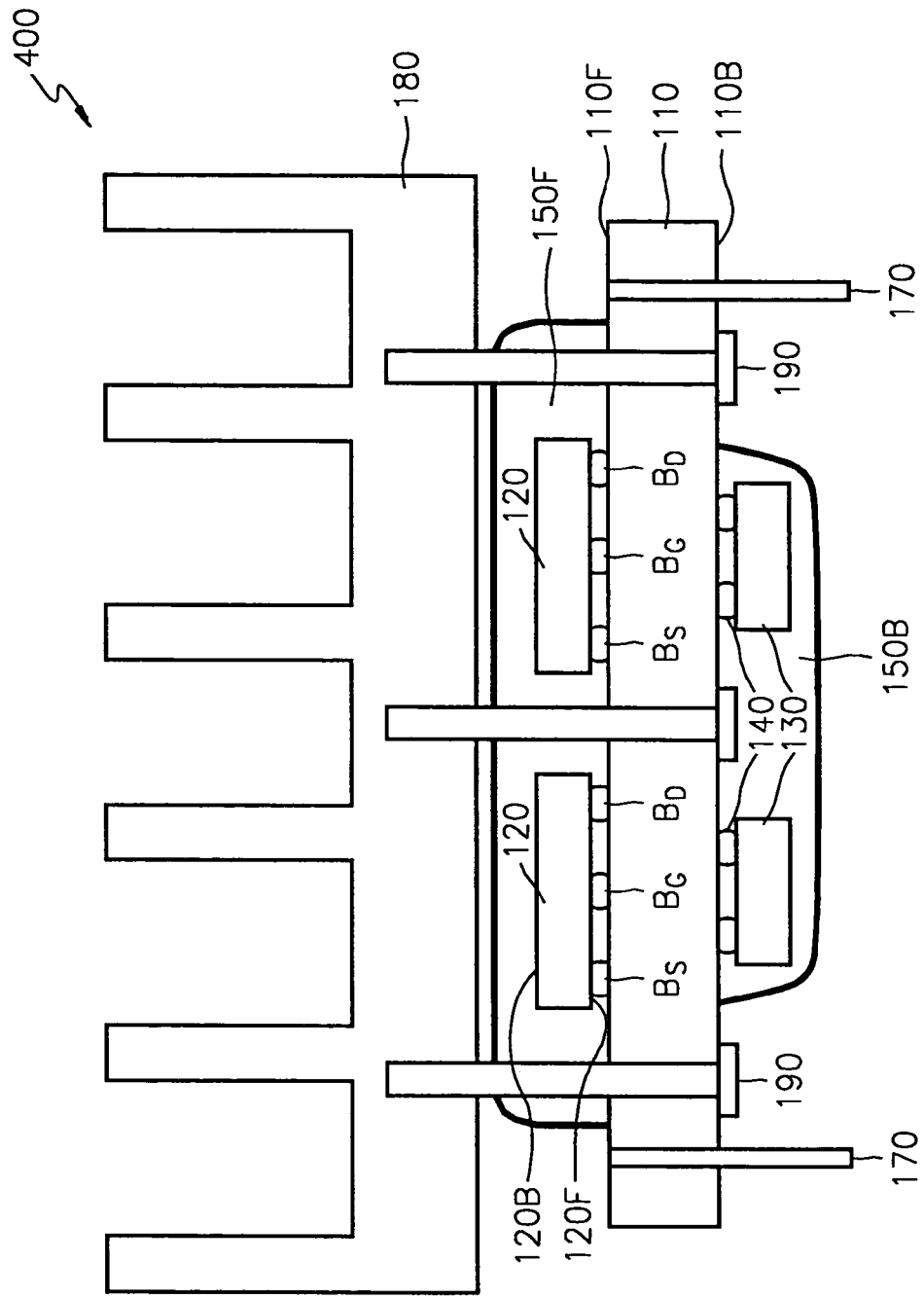
FIG. 5 is a cross-section of a power module flip chip package according to a fourth embodiment of the present invention.

FIG. 5 is a cross-section of a power module flip chip package 400 according to a fourth embodiment of the present invention.

The fourth embodiment is suitable for dissipating heat and conserving space which are both important features. A power semiconductor device 120 is coupled to a front surface 110F of a package carrier 110 and auxiliary devices 130 are coupled to a back surface 110B of a package carrier 110, and thus the horizontal area of the package can be reduced. A front surface epoxy resin 150F covering the power semiconductor device 120 and a back surface epoxy resin 150B covering the auxiliary devices 130 are respectively formed on the front surface 110F and the back surface 110B of the package carrier 110. In this case, the power semiconductor device 120 is the main heat source, and therefore the heat sink 180 is preferably formed on the front surface epoxy resin 150F covering the power semiconductor device 120.

Figure 6:
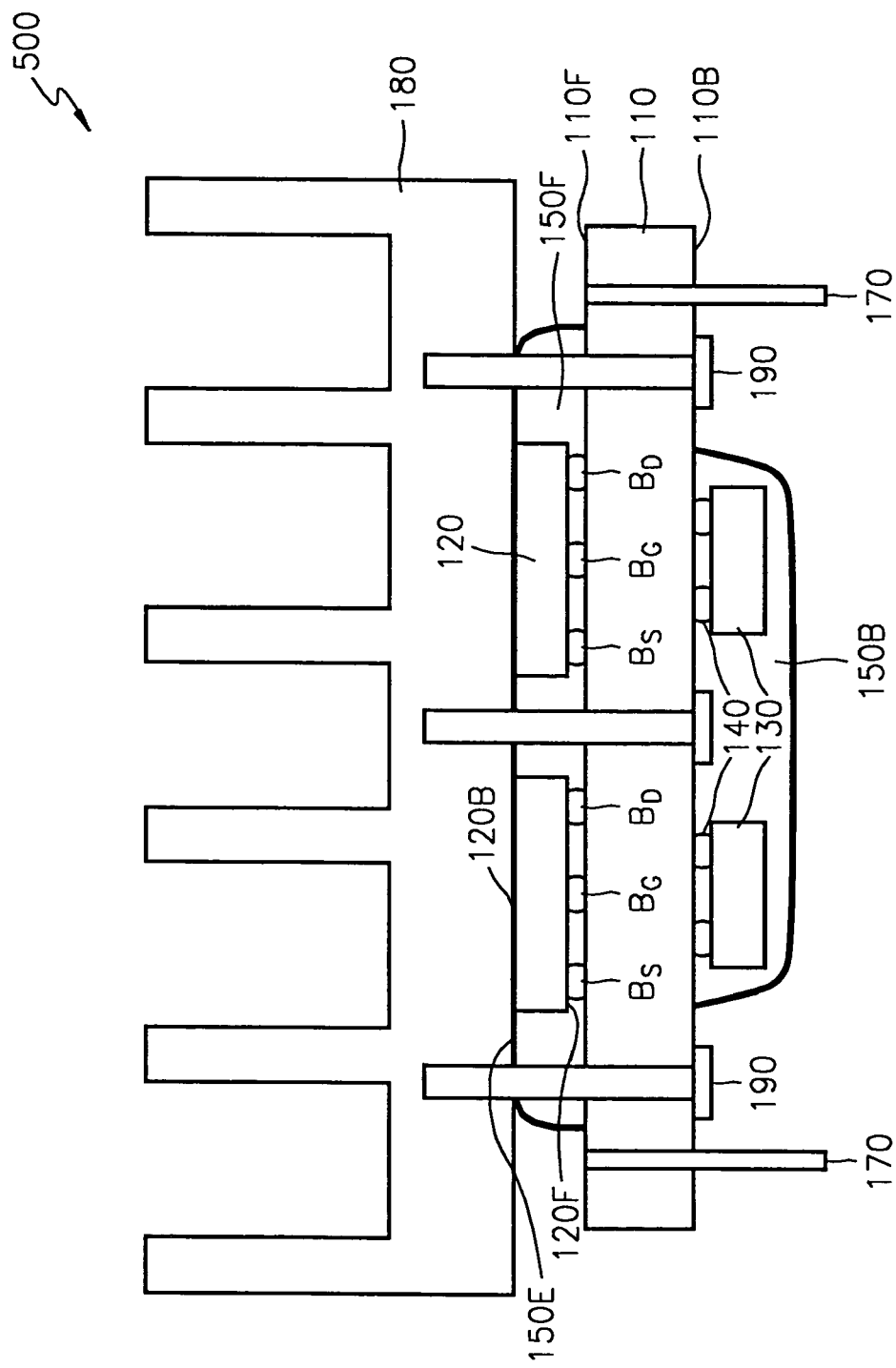
FIG. 6 is a cross-section of a power module flip chip package according to a fifth embodiment of the present invention.

FIG. 6 is a cross-section of a power module flip chip package 500 according to a fifth embodiment of the present invention. The fifth embodiment is suitable for the case where the heat resistant function is the important parameter in the package. The front surface 120F of the power semiconductor devices 120 is connected to a lead frame, that is the package carrier 110, using a flip chip method and is covered by the epoxy resin 150. The back surface 120B of the power semiconductor device 120 is exposed through the epoxy resin 150 such that the back surface 120B of the power semiconductor device and an external surface 150E of the epoxy resin 150 lie in the same plane. The heat resistant function is further improved in the fifth embodiments of the present invention over the second through the fourth embodiments of the present invention since a heat sink 180 is in direct contact with the back surface 120B of the power semiconductor device 120.

As a result, the production of the power module flip chip package according to the preferred embodiments of the present invention has the simple five or six manufacturing procedures including: sawing a wafer; flip chip bonding; forming a protection layer such as an EMC, for example a molding; attaching a ball (optional); final testing; and marking.

Furthermore, the power semiconductor device is connected to one package substrate in the flip chip method. Therefore, the resistance and the inductance are reduced and reliability is increased without the wire bonding. In addition, the preferred embodiments of the present invention can be flexibly applied to various combinations of the power semiconductor device and the auxiliary device in different applications by modifying the layout of the traces on the package substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power module flip chip package comprising:
   a package carrier having a front surface on one side and a back surface on an opposite side;
   one or more power vertical metal oxide semiconductor field effect transistors electrically connected to the front surface of the package via a first set of conductive bumps located between the power semiconductor and the front surface of the package carrier, wherein the conductive bumps are electrically connected to a gate terminal, a source terminal, and a drain terminal of the power vertical metal oxide semiconductor field effect transistors;
   a second set of conductive bumps located on the back side of the carrier and connected to the first set of conductive bumps;
   a protective material covering the power vertical metal oxide semiconductor field effect transistor(s) and enclosing the power vertical metal oxide semiconductor transistor(s) and the first set of conductive bumps;
   wherein the power vertical metal oxide semiconductor field effect transistor(s) comprises a conductive housing in electrical contact with the drain and having portions extending away from the drain and terminating in one or more conductive bumps in substantially the same plane as the first set of conductive bumps.

2. The power module flip chip package of claim 1 wherein the second set of conductive bumps is not covered by said protective material.

3. The power module flip chip package of claim 1 wherein the protective material is a plastic encapsulant.

4. The power module flip chip package of claim 1 further comprising an auxiliary device die disposed on the front side of the carrier and having a third set of conductive bumps for connecting the auxiliary device to the power vertical metal oxide semiconductor field effect transistor and to the second set of conductive bumps.

5. The power module flip chip package of claim 1 wherein the drain of the power vertical metal oxide semiconductor field effect transistor(s) is or are electrically connected to the conductive housing via a conductive solder.

6. The power module flip chip package of claim 1 further comprising a heat sink.

7. The power module flip chip package of claim 6 wherein the heat sink is coupled to the back surface of the package carrier.

8. The power module flip chip package of claim 6 wherein the heat sink is coupled to the package carrier and over the protective material.

9. The power module flip chip package of claim 8 wherein the heat sink is on the protective material that covers the power vertical metal oxide semiconductor field effect transistor(s)

10. The power module flip chip package of claim 8 wherein the heat sink is spaced from the protective material that covers the power vertical metal oxide semiconductor field effect transistor(s).

* * * * *

UNITED STATES PATENT AND TRADEMARK OFFICE
CERTIFICATE OF CORRECTION

PATENT NO.         : 7,492,043 B2                                           Page 1 of 1
APPLICATION NO.    : 10/927424
DATED              : February 17, 2009
INVENTOR(S)        : Seung-yong Choi and Jonathan A. Noquil It is certified that error appears in the above-identified patent and that said Letters Patent is hereby corrected as shown below:

Title Page; item (73);
    The assignee of this application is noted incorrectly on the front page in the bibliographic section as "Fiarchild" Korea Semiconductor, Ltd. The correct spelling of the assignee's name is "Fairchild" Korea Semiconductor, Ltd. as indicated on the Notice of Recordation of Assignment document in this matter (copy attached.)

Signed and Sealed this

Seventh Day of April, 2009

JOHN DOLL
*Acting Director of the United States Patent and Trademark Office*